United States Patent [19]

Kamide

[11] Patent Number: 5,741,742
[45] Date of Patent: Apr. 21, 1998

[54] FORMATION OF ALUMINUM-ALLOY PATTERN

[75] Inventor: Yukihiro Kamide, Kanagawa, Japan

[73] Assignee: Sony Corporation, Tokyo, Japan

[21] Appl. No.: 695,526

[22] Filed: Aug. 12, 1996

Related U.S. Application Data

[63] Continuation of Ser. No. 300,222, Sep. 6, 1994, abandoned.

[30] Foreign Application Priority Data

Sep. 10, 1993  [JP]  Japan ............... 5-249809

[51] Int. Cl.$^6$ .................. H01L 21/283; H01L 21/31
[52] U.S. Cl. .............. 438/653; 438/688; 438/696; 438/717
[58] Field of Search ................. 437/190, 194, 437/199, 197, 228; 156/643.1, 653.1, 656.1; 438/653, 688, 695, 696, 706, 717, 963

[56] References Cited

U.S. PATENT DOCUMENTS

| | | | |
|---|---|---|---|
| 4,828,649 | 5/1989 | Davis et al. | 156/643 |
| 4,915,779 | 4/1990 | Srodes et al. | 156/643 |
| 5,024,722 | 6/1991 | Cathey, Jr. | 156/643 |
| 5,217,570 | 6/1993 | Kadomura | 156/665 |
| 5,369,053 | 11/1994 | Fang | 437/194 |

FOREIGN PATENT DOCUMENTS

| | | | |
|---|---|---|---|
| 62-238649 | 10/1987 | Japan | 437/194 |
| 1-80044 | 3/1989 | Japan | 437/194 |
| 4-330724 | 11/1992 | Japan | 437/199 |
| 5-109673 | 4/1993 | Japan | 437/194 |

OTHER PUBLICATIONS

Kamide et al, "HBr Added High Selective Etch Process of Al Alloy Multi-Layers", Proceedings of the 4th Symposium on Semiconductors and Integrated Circuits Technology, Dec. 19-20, 1991, pp. 121-126.

Aoki et al, "After-Corrosion Suppression Using Low-Temperature Al-Si-Cu Etching", Proceedings of Symposium on Dry Process, Nov. 1-2, 1990 pp. 141-145.

*Primary Examiner*—T. N. Quach
*Attorney, Agent, or Firm*—Ronald P. Kananen

[57] ABSTRACT

A method of forming an aluminum-alloy pattern at room temperature, which is capable of eliminating the generation of after-corrosion and enhancing the anisotropic processing. In a first step, an etching mask made of a silicon nitride based film is formed on an aluminum-alloy film formed on a barrier metal layer which is formed on a substrate. In a second step, the aluminum-alloy film is dry-etched at room temperature, to form a pattern of the aluminum-alloy film. The etching selection ratio of the aluminum-alloy film to the etching mask is thus improved, and further a sidewall protective film made of aluminum nitride is formed on the etching sidewall, thereby sufficiently performing the anisotropic processing for the aluminum-alloy pattern. In subsequent steps, the barrier metal layer may also be etched and removed at room temperature, and a further sidewall protective film made of aluminum oxide is formed on the etching sidewall as a result of oxygen plasma processing. Any remaining barrier metal layer may be perfectly removed as a final step as a result of over-etching.

5 Claims, 4 Drawing Sheets

FORMATION OF ALUMINUM-ALLOY PATTERN

This application is a continuation of application Ser. No. 08/300,222 filed Sep. 6, 1994, abandoned.

BACKGROUND OF THE INVENTION

1. Field of the Invention

The present invention relates to a method of manufacturing an integrated semiconductor device, and particularly to a method of forming a conductive layer of aluminum-alloy in the integrated semiconductor device.

2. Description of Related Art

Aluminum-alloys are variously used as materials of metallization and electrodes formed on substrates in semiconductor integrated circuits. The metallization and electrodes using these aluminum-alloy are generally formed by dry-etching with a mixture gas containing a chlorine based gas using photoresist as an etching mask. In this dry-etching, the decomposed component of the photoresist by dry-etching is stuck on etching sidewall for forming a sidewall protective film, thus achieving the anisotropic shape of the formed aluminum-alloy pattern.

In recent years, aluminum-alloy patterns with fine structures have been required, along with strong demands in the field of semiconductor integrated circuits toward the high integration and the high function.

A thin photoresist film must be used for precisely forming an aluminum-alloy pattern with fine line-widths in terms of the photosensitivity of the photoresist used for the etching mask.

On the other hand, the aluminum-alloy pattern with fine line-widths must be somewhat thick in the film thickness for keeping the reliability against electromigration.

Accordingly, to form the above aluminum-alloy pattern on the semiconductor integrated circuit with a fine structure, it is required to etch the aluminum-alloy film while suppressing the consumption of the thinned photoresist film by improving the etching selection ratio between the photoresist and the aluminum-alloy.

There have been proposed a process of performing the above etching by suppressing the incident energy of etching ions for improving the resistance of a photoresist film against the etching ions, and a process of performing the above etching while forming a protective film on the peripheral wall of an photoresist film.

Moreover, there has been proposed a process using an inorganic material such as silicon oxide as an etching mask. In this process, the resistance of the etching mask is improved; however, a sidewall protective film is not formed on an etching sidewall by the usual etching method performed at room temperature. As a result, the aluminum-alloy pattern cannot be formed in an anisotropic shape.

However, it is reported that an anisotropic shape can be obtained by performing the dry-etching by cooling the substrate temperature at a lower temperature less than 0° C.

An anisotropic shape of an aluminum-alloy pattern can be also obtained by the dry-etching using an etching gas which is added with a gas for forming a sidewall protective film on an etching sidewall made of an aluminum-alloy film, for example nitrogen gas.

However, the above-described processes have the following disadvantages.

Namely, in the case of forming an aluminum-alloy pattern on a substrate, a barrier metal layer made of, for example titanium oxy-nitride is formed between the substrate and the aluminum-alloy pattern, and the barrier layer is also dry-etched together with the above aluminum-alloy pattern. In this dry-etching, the etching rate of titanium oxy-nitride is dependent on the incident energy of etching ions contained in an etching gas.

Accordingly, in the prior art process of performing the etching while suppressing the incident energy of etching ions, the total consumption of the photoresist in the etching for the aluminum-alloy film and the barrier metal layer cannot be suppressed, and thereby the etching mask is consumed before the etching is sufficiently performed.

In the prior art process of forming a protective film on the peripheral wall of a photoresist film, the protective film is difficult to be separated in the subsequent process, which causes a fear in generating after-corrosion due to chlorine as the component of the etching gas contained in the protective film.

In the process using an inorganic material as an etching mask wherein the etching is performed by cooling a substrate temperature at a lower temperature less than 0° C., there are disadvantages that the equipment cost is increased; and various gas molecules in the etching atmosphere are stuck on a sample because of the etching performed at a low temperature, causing the generation of after-corrosion.

Moreover, in the case of the dry-etching using an etching gas added with nitrogen gas, a material forming a sidewall protective film is scattered in a chamber, which causes the contamination in the interior of the chamber.

SUMMARY OF THE INVENTION

An object of the present invention is to provide a method of forming an aluminum-alloy pattern at room temperature, which is capable of eliminating the generation of after-corrosion and enhancing the anisotropic processing.

To achieve the above object, according to a first invention, there is provided a method of forming an aluminum-alloy pattern, including the steps of: forming an etching mask made of silicon nitride based film on an aluminum-alloy film formed on a substrate, and dry-etching the aluminum-alloy film at room temperature for forming a pattern of the aluminum-alloy film.

Moreover, according to a second invention, there is provided a method of forming an aluminum-alloy pattern, including the steps of: forming, on an aluminum-alloy film formed on a substrate, an etching mask having a layered structure of a lower layer mask having a resistance against an etching gas used for dry-etching the aluminum-alloy film and an upper layer mask for supplying a component forming a sidewall protective film on an etching sidewall upon dry-etching the aluminum alloy film, and dry-etching the aluminum-alloy film at room temperature for forming a pattern of the aluminum-alloy film.

In the above second invention, the lower layer comprises a silicon nitride based film or a silicon oxide based film and the upper layer comprises a resist film or silicon nitride based film.

The dry-etching method in the present invention is made to etch a conductive pattern of aluminum-alloy by the multiplier effect of a neutral active seed and reactive gas ions using reactive gas plasma.

The silicon nitride based film in the present invention may include a silicon nitride film, a silicon oxy-nitride film and a plasma silicon nitride (P—SiN) film; and the silicon oxide film in the present invention may include a silicon dioxide film and a plasma TEOS oxide film.

In the method of forming an aluminum-alloy pattern according to the first invention, the dry-etching for an aluminum-alloy film is performed using a silicon nitride based film as an etching mask. The silicon nitride film has a resistance for an etching gas used for dry-etching the aluminum-alloy film. Accordingly, the etching selection ratio of the aluminum-alloy film is improved, and the etching for forming the aluminum-alloy film is sufficiently performed using the silicon nitride film as an etching mask. Moreover, the silicon nitride based film releases nitrogen upon dry-etching the aluminum-alloy film. The nitrogen thus released forms a sidewall protective film made of aluminum nitride on the etching sidewall. The aluminum-alloy pattern is thus formed in an anisotropic shape by this etching. Moreover, the above dry etching is performed at room temperature, so that gas molecules in the etching atmosphere are not absorbed by the substance to be etched.

Next, in the method of forming an aluminum-alloy pattern according to the second invention, the dry-etching for an aluminum-alloy pattern is performed using an etching mask having a layered structure of an upper layer mask and a lower layer mask. First, the dry-etching for the aluminum-alloy film is performed using the upper layer mask for supplying a component forming a sidewall protective film on an etching sidewall. As a result, the aluminum-alloy pattern formed by this etching becomes an anisotropic shape. After that, the dry-etching for the aluminum-alloy film is performed using the lower layer mask having a resistance against etching ions used for the dry-etching of the aluminum-alloy film. As a result, it becomes possible to sufficiently dry-etch the aluminum-alloy film by improvement in the etching selection ratio of the aluminum-alloy film. Moreover, since the dry-etching is performed at room temperature, gas molecules in the etching atmosphere are not absorbed by the substance to be etched.

In the case using a resist film as the upper layer, the decomposed material of the resist film is formed as the above sidewall protective film. In the case using a silicon nitride based film as the upper layer mask, an aluminum nitride film is formed as the sidewall protective film. Moreover, in the case using a silicon nitride based film or silicon oxide based film, there can be obtained the etching mask having a resistance against an etching gas used for dry-etching the aluminum-alloy film.

DETAILED DESCRIPTION OF THE PREFERRED EMBODIMENT

A first embodiment of the present invention will be described with reference to FIGS. 1A to 1C and FIGS. 2A to 2B.

Figure 1A:
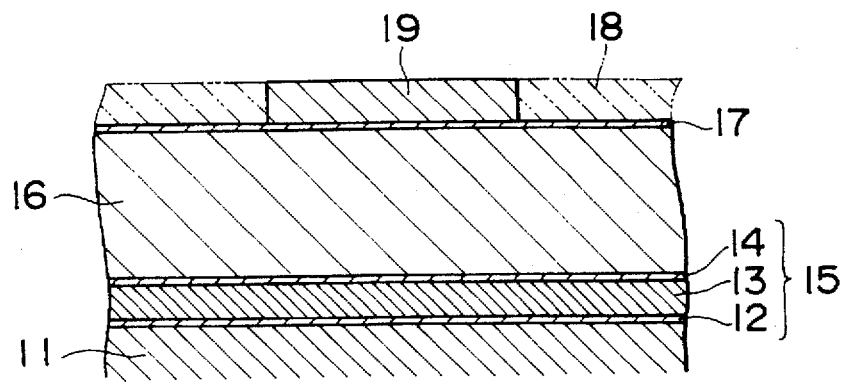
FIGS. 1A to 1C are typical sectional views for illustrating a first embodiment.

First, as shown in FIG. 1A, a barrier metal layer 15 having a layered structure of a titanium film 12, a titanium oxynitride film 13 and a titanium film 14 was formed by sputtering on the upper surface, made of an oxide film, of a substrate 11.

An aluminum-alloy film 16 containing, for example 1% of silicon was formed on the upper surface of the barrier metal layer 15.

First, as a first step, a TiON film was formed as a reflection preventive film 17 on the upper surface of the aluminum-alloy film 16. A plasma silicon nitride (P—SiN) 18 having a thickness of 300 nm was formed on the upper surface of the reflection preventive film 17 by plasma CVD.

After that, a resist film (not shown) was formed on the upper surface of the P—SiN film 18 by the resist coating of the usual photolithography process. The resist film was subjected to sensitization and development, thus forming a resist mask (not shown) in which the resist film is patterned to a metallization pattern.

Subsequently, the portion of the P—SiN film 18 shown by the two-dotted line was removed, for example by reactive ion etching using the above photoresist mask as an etching mask, to form an etching mask 19 patterned to the metallization pattern.

As one example of the etching condition, a mixture gas of $CHF_3$ and $O_2$ was used as the etching gas, and the flow rates of the gases were set at $CHF_3/O_2$=75/25 sccm. The pressure in the etching atmosphere was set at 4 Pa, and the RF power was set at 1000 W. The etching time was set at 10 min.

After that, the above resist mask was removed, for example by ashing using oxygen plasma, and the remaining resist mask was removed using fuming nitric acid.

Figure 1B:
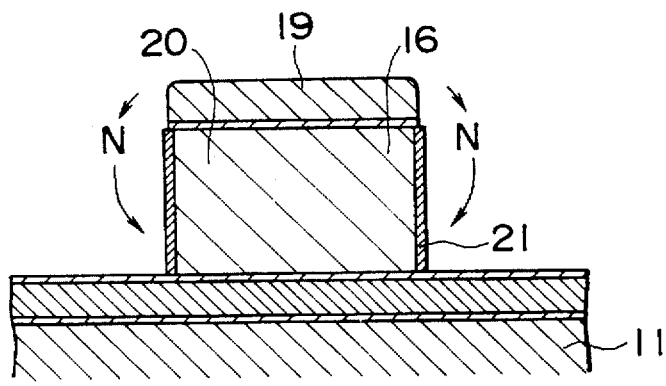

Next, as shown in FIG. 1B, as a second step, the aluminum-alloy film 16 was dry-etched at room temperature (20° to 40° C.) in a magnetic field microwave plasma etching apparatus, to form an aluminum-alloy pattern 20.

As one example of the etching condition, a mixture gas of $BCl_3$, $Cl_2$ and Ar (argon) was used as the etching gas, and the flow rates of the gases were set at $BCl_3/Cl_2/Ar$=40/60/50 sccm. The pressure of the etching atmosphere was set at 1 Pa, the microwave power was 950 W, and the RF power (2 MHz) was 30 W.

In the above etching, the reflection preventive film 17 is first etched by etching ions, and then the aluminum-alloy film 16 is etched. At this time, P—SiN forming the etching mask 19 is decomposed by the etching of the surface of the etching mask 19, to generate nitrogen (N). The etching sidewall of the aluminum-alloy film 16 is nitrided by the generated nitrogen (N) as shown by the arrow in the figure, to form a sidewall protective film 21 made of aluminum nitride (AlNx). The aluminum-alloy film 16 is etched in the direction substantially perpendicular to the substrate 11 by the sidewall protective film 21, so that the formed aluminum-alloy pattern 20 is formed in an anisotropic shape. Moreover, since the etching mask 19 has a resistance against the etching ions, in the dry-etching under the above condition, all of the etching mask 19 having a thickness of 300 nm is not consumed.

Figure 1C:
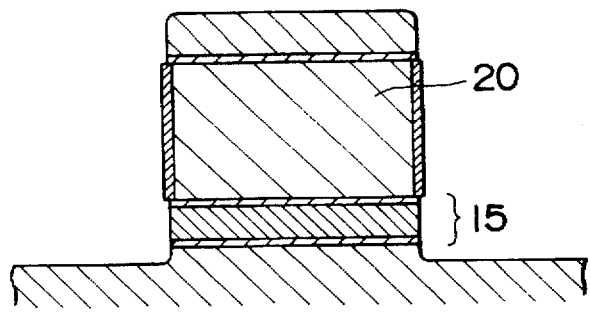

After the aluminum-alloy pattern 20 was thus formed, the barrier metal 15 was subsequently etched by the above dry-etching, as shown in FIG. 1C.

Figure 2A:
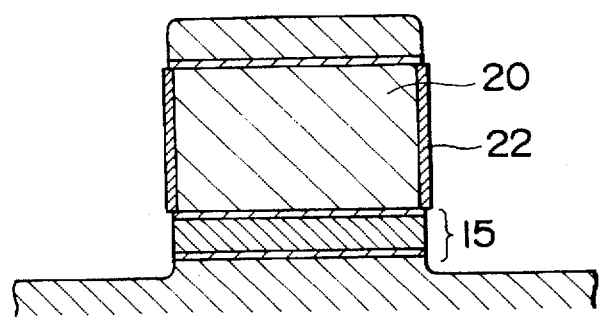
FIGS. 2A to 2B are typical sectional views for illustrating the first embodiment.

As shown in FIG. 2A, aluminum oxide (AlOx) 22 was then formed on the sidewall of the aluminum-alloy pattern 20 by oxygen plasma processing in the same chamber as in the above etching.

As one example of the oxygen plasma processing, the flow rate of oxygen gas was set at 200 sccm, the pressure of the processing atmosphere was 2 Pa, and the microwave power was 950 W. The processing time was set at 10 sec.

Next, the over-etching for perfectly removing the remaining metal on the substrate 11 was performed in the following condition. A mixture gas of $BCl_3$, $Cl_2$ and Ar was used as an etching gas, and the flow rates of the gases were set at $BCl_3/Cl_2/Ar=40/60/50$ sccm. The pressure of the etching atmosphere was set at 1 Pa, and the microwave power was set at 950 W. The over-etching time was set at 10 sec.

In this over-etching, the sidewall of the aluminum-alloy pattern 20 is protected by the aluminum oxide (AlOx) 22 formed on the sidewall of the aluminum-alloy pattern 20.

Figure 2B:
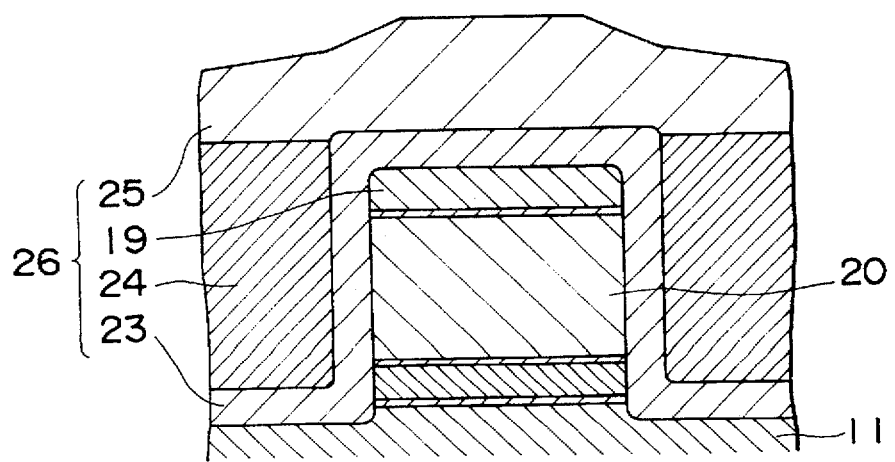

After that, as shown in FIG. 2B, on the substrate 11, there was formed an interlayer insulating film 26 having a layered structure of an etching mask 19 remaining on the aluminum-alloy pattern 20 formed in the above, a plasma (P)-TEOS (Tetra Ethyl Ortho Silicate) oxide film 23, an ozone ($O_3$)-TEOS oxide film 24 planarized on its surface, and a P-TEOS oxide film 25.

Next, a second embodiment of the present invention will be described with reference to FIGS. 3A to 3B and FIGS. 4A to 4C.

Figure 3A:
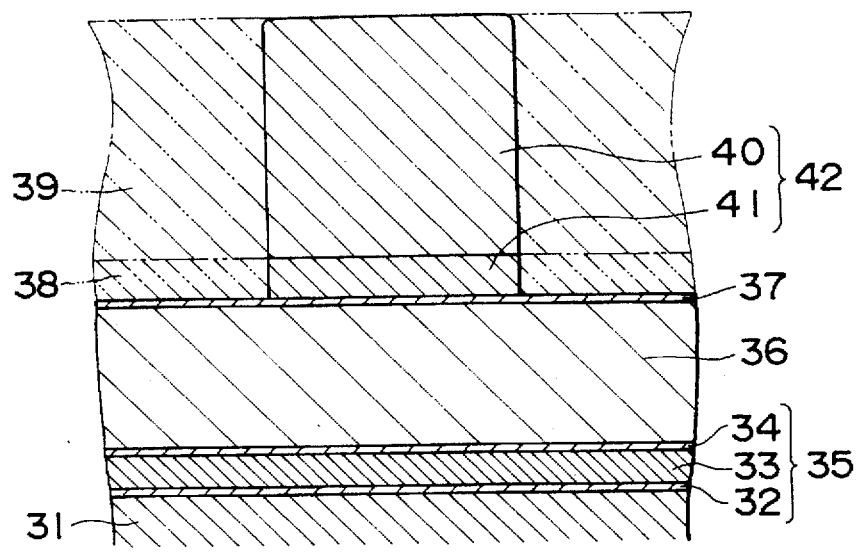
FIGS. 3A to 3B are typical sectional views for illustrating a second embodiment.

First, as shown in FIG. 3A, like the first embodiment, a barrier metal layer 35 having a layered structure of a titanium film 32, a titanium oxy-nitride film 33 and a titanium film 34 was formed on a substrate 31. An aluminum-alloy film 36 containing, for example 1% of silicon was formed on the upper surface of the barrier metal layer 35.

First, as a first step, like the first embodiment, a TiON film was formed on the upper surface of the aluminum-alloy film 36 as a reflection preventive film 37. A P-TEOS oxide film 38 having a thickness of 200 nm was formed on the upper surface of the reflection preventive film 37 by plasma CVD, and photoresist was coated on the upper surface of the P-TEOS film 38, to form a resist film 39.

The resist film 39 was then subjected to sensitization and development, and the portion of the resist film 39 shown by the two-dotted line was removed, to form an upper layer mask 40 patterned to a metallization pattern.

A lower layer mask 41 was then formed by etching the P-TEOS oxide film 38 in a magnetic field microwave plasma etching using the upper layer mask 40 as an etching mask. As one example of the etching condition, a mixture gas of $C_4F_8$ and $CH_2F_2$ was used as an etching gas. The flow rates of the gases were set as $C_4F_8/CH_2F_2=15/10$ sccm. The pressure of the etching atmosphere was set at 0.1 Pa, the microwave power was 1200 W, and the RF power (2 MHz) was 30 W. The over-etching was performed for 70 sec under this condition.

An etching mask 42 having a layered structure of the lower layer mask 41 and the upper layer mask 40 was thus formed.

Figure 3B:
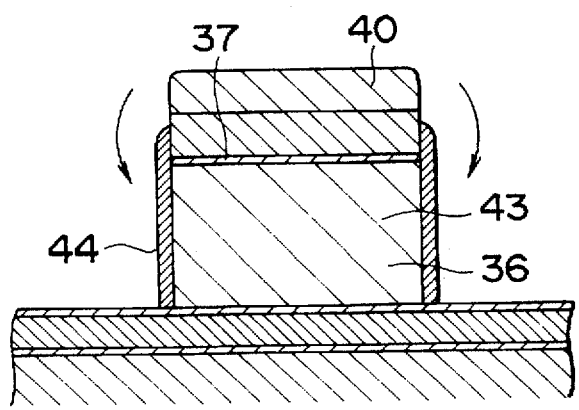

Next, as shown in FIG. 3B, as a second step, the aluminum-alloy film 36 was etched by the magnetic field plasma etching apparatus, to form an aluminum-alloy pattern 43.

As one example of the etching condition, a mixture gas of $BCl_3$, $Cl_2$ and Ar was used as an etching gas. The flow rates of the gases were set at $BCl_3/Cl_2/Ar=20/30/50$ sccm. The pressure of the etching atmosphere was set at 2 Pa, the microwave power was set at 950 W, and the RF power (2 MHz) was set at 30 W. The just-etching was performed under this condition.

In the above etching, the reflection preventive film 37 is first dry-etched by etching ions, and the aluminum-alloy film 36 is then dry-etched. At this time, by etching of the surface of the upper layer mask 40, the decomposed material of the photoresist forming the upper layer mask 40 is generated. This decomposed material is stuck on the etching sidewall of the aluminum-alloy film 36 as shown by the arrow in the figure, to form a sidewall protective film 44. The aluminum-alloy film 36 is etched in the direction substantially perpendicular to the substrate 11 by the sidewall protective film 44.

Figure 4A:
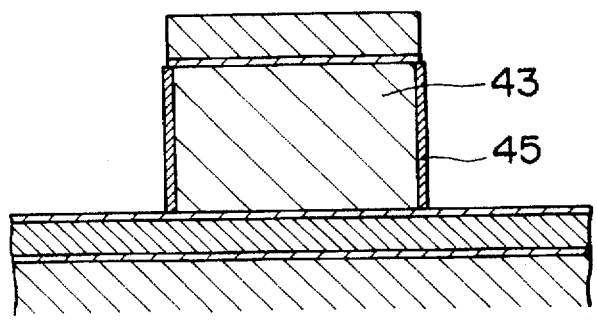
FIGS. 4A to 4C are typical sectional views for illustrating the second embodiment.

After the etching of the aluminum-alloy film 36 was completed, as shown in FIG. 4A, the residue of the upper layer mask 40 made of photoresist and the sidewall protective film 44 made of the resist decomposition material were removed by an asher contained in the etching apparatus, and an aluminum oxide ($Al_2O_3$) 45 was produced on the sidewall of the aluminum-alloy pattern 43.

As one example of the ashing condition, the flow rate of oxygen gas was set at 200 sccm, the pressure of the processing atmosphere was 2 MPa, the microwave power was 1200 W, and the processing temperature was 250° C. The processing was performed for 120 sec on this condition.

Figure 4B:
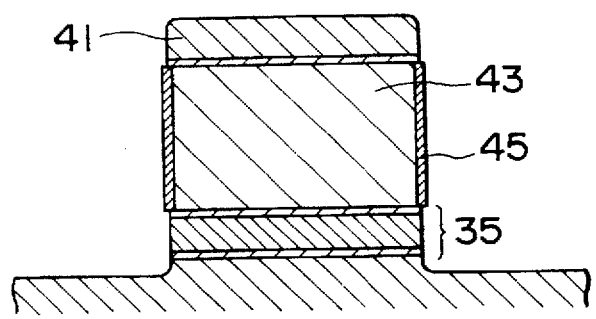

Next, as shown in FIG. 4B, the barrier metal 35 was etched in the etching chamber of the above etching apparatus.

As one example of the etching condition, a mixture gas of $BCl_3$, $Cl_2$ and Ar was used as an etching gas. The flow rates of the gases were set at $BCl_3/Cl_2/Ar=20/30/50$ sccm. The pressure of the etching atmosphere was set at 2 Pa, the microwave power was 950 W, and the RF power (2 MHz) was 30 W.

In this etching, the sidewall of the aluminum-alloy pattern 43 is protected by aluminum oxide (AlOx) formed on the sidewall formed on the aluminum-alloy pattern 43. Moreover, since the lower layer mask 41 made-of $SiO_2$ having a resistance against incident etching ions by the etching covers the surface of the aluminum-alloy pattern 43, it becomes possible to ensure the anisotropic shape of the aluminum-alloy pattern 43.

Figure 4C:
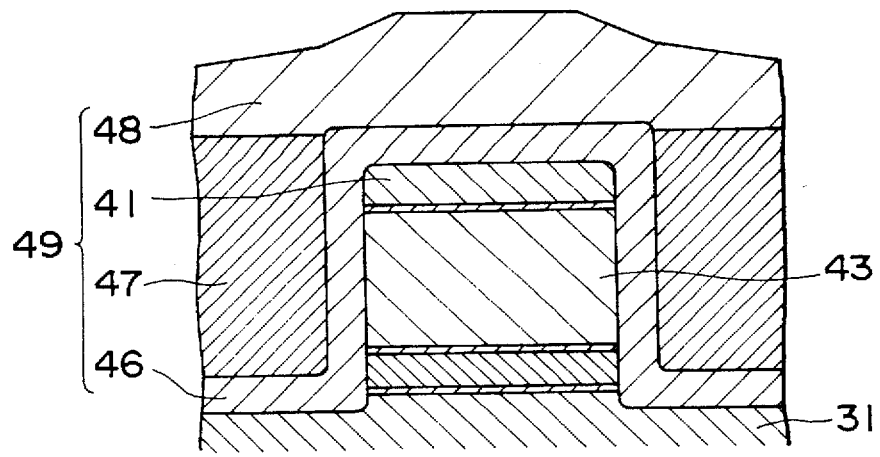

After that, as shown in FIG. 4C, like the first embodiment, on the substrate 31, there was formed an interlayer insulating film 49 having a layered structure of the lower layer mask 41 remaining on the aluminum-alloy pattern 43, a P-TEOS oxide film 46, a planarized $O_3$-TEOS oxide film 47, and a P-TEOS oxide film 48.

In the second embodiment, the etching mask having the layered structure of the upper layer mask made of photoresist and the lower layer mask made of silicon oxide ($SiO_2$) is formed on the aluminum-alloy film. However, the etching mask may be formed of a layered structure of an upper layer mask made of silicon nitride based film such as a silicon nitride (SiN) film or a silicon oxy-nitride (SiON) film, and a lower mask made of $SiO_2$. Moreover, it may be formed of a layered structure of an upper layer made of photoresist and a lower layer mask made of SiN.

What is claimed is:

1. A method of manufacturing an integrated semiconductor device comprising the steps of:

forming a barrier metal layer over a substrate;

forming a conductive layer of aluminum-alloy over said barrier metal layer;

providing a patterned mask layer comprising a silicon nitride based film on the conductive layer, the mask layer having a resistance against an etching gas used for etching the conductive layer and a function of supplying a component forming a film for protecting a sidewall of the conductive layer;

patterning the conductive layer by dry-etching by using the patterned mask layer at or about room temperature wherein said mask layer deposits a protection film on the sidewall of the conductive layer;

patterning the barrier metal layer by dry-etching;

oxygen plasma processing for forming aluminum oxide on the side wall of the conductive layer; and over-etching for perfectly removing the remaining part of the barrier metal layer on the substrate.

2. A method of manufacturing an integrated semiconductor device according to claim 1, wherein a reflection preventive layer film is provided between the conductive layer and the patterned mask layer.

3. A method of manufacturing an integrated semiconductor device comprising-the steps of:

forming a barrier metal layer over a substrate;

forming a conductive layer of aluminum-alloy over said barrier metal layer;

providing a double-layered mask on the conductive layer, the double-layered mask comprising a lower mask having a resistance against an etching gas used for etching the conductive layer and an upper layer comprising a silicon nitride based film for supplying a component forming a film for protecting a sidewall of the conductive layer upon etching the conductive layer;

patterning the conductive layer by dry-etching by using the double-layered mask at or about room temperature wherein said upper layer deposits a protection film on the sidewall of the conductive layer;

oxygen plasma processing for removing said upper mask layer and forming aluminum oxide on the side wall of the conductive layer;

patterning the barrier metal layer by dry-etching; and over-etching for perfectly removing the remaining part of the barrier metal layer on the substrate.

4. A method of manufacturing an integrated semiconductor device according to claim 3, wherein the lower layer mask comprises at least one substance selected from the group consisting of a silicon nitride based film and a silicon oxide based film.

5. A method of manufacturing an integrated semiconductor device according to claim 3, wherein a reflection preventive film is provided between the conductive layer and the patterned mask layer.

* * * * *